(12) United States Patent
Stevens et al.

(10) Patent No.: US 8,357,433 B2
(45) Date of Patent: Jan. 22, 2013

(54) POLYMER BRUSHES

(75) Inventors: Gary C. Stevens, West Horsley (GB); James D. B. Smith, Monroeville, PA (US); John W. Wood, Winter Springs, FL (US)

(73) Assignee: Siemens Energy, Inc., Orlando, FL (US)

( * ) Notice: Subject to any disclaimer, the term of this patent is extended or adjusted under 35 U.S.C. 154(b) by 643 days.

(21) Appl. No.: 12/164,591

(22) Filed: Jun. 30, 2008

(65) Prior Publication Data

US 2008/0262128 A1     Oct. 23, 2008

Related U.S. Application Data

(63) Continuation-in-part of application No. 11/152,983, filed on Jun. 14, 2005, now abandoned.

(51) Int. Cl.
*H01B 1/06* (2006.01)
(52) U.S. Cl. .................. 427/386; 427/384; 427/385.5; 427/387; 442/149; 252/500; 252/510; 252/511; 428/361; 428/364; 428/368; 428/370; 428/371; 428/375; 428/377; 428/383
(58) Field of Classification Search .................. 524/430; 442/149; 252/500, 510, 511; 427/384, 385.5, 427/386, 387; 428/361, 364, 368, 370, 371, 428/375, 377, 383
See application file for complete search history.

(56) References Cited

U.S. PATENT DOCUMENTS

| | | | |
|---|---|---|---|
| 2,996,106 A | 8/1961 | McCarthy | |
| 3,069,302 A | 12/1962 | Lewis et al. | |
| 3,207,641 A | 9/1965 | Small et al. | |
| 3,246,271 A | 4/1966 | Ford | |
| 3,427,189 A | 2/1969 | Brechna | |
| 3,866,316 A | 2/1975 | Takechi et al. | |
| 3,868,613 A | 2/1975 | Rogers, Jr. et al. | |
| 3,960,803 A | 6/1976 | Smith et al. | |
| 3,974,302 A | 8/1976 | Croop et al. | |
| 4,001,616 A | 1/1977 | Lonseth et al. | |
| 4,160,926 A | 7/1979 | Cope et al. | |
| 4,308,476 A | 12/1981 | Schuler | |
| 4,335,367 A | 6/1982 | Mitsui et al. | |
| 4,361,661 A | 11/1982 | Jackson | |
| 4,400,226 A | 8/1983 | Horrigan | |
| 4,427,740 A | 1/1984 | Stackhouse et al. | |
| 4,491,618 A | 1/1985 | Kuwajima et al. | |
| 4,634,911 A | 1/1987 | Studniarz et al. | |
| 4,694,064 A | 9/1987 | Tomalia et al. | |
| 4,704,322 A | 11/1987 | Roberts | |
| 4,760,296 A | 7/1988 | Johnston et al. | |
| 4,806,806 A | 2/1989 | Hjortsberg et al. | |
| 5,011,872 A | 4/1991 | Latham et al. | |
| 5,037,876 A | 8/1991 | Birkle et al. | |
| 5,106,294 A | 4/1992 | Profos | |
| 5,126,192 A | 6/1992 | Chellis et al. | |
| 5,225,471 A | 7/1993 | Tajima et al. | |
| 5,281,388 A | 1/1994 | Palmer et al. | |
| 5,288,769 A | 2/1994 | Papageorge et al. | |
| 5,409,968 A | 4/1995 | Clatanoff et al. | |
| 5,433,906 A | 7/1995 | Dasch et al. | |
| 5,466,431 A | 11/1995 | Dorfman et al. | |
| 5,490,319 A | 2/1996 | Nakamura et al. | |
| 5,510,174 A | 4/1996 | Litman | |
| 5,540,969 A | 7/1996 | Schuler | |
| 5,578,901 A | 11/1996 | Blanchet-Fincher et al. | |
| 5,688,382 A | 11/1997 | Besen et al. | |
| 5,710,475 A | 1/1998 | Irwin et al. | |
| 5,723,920 A | 3/1998 | Markovitz et al. | |
| 5,780,119 A | 7/1998 | Dearnaley et al. | |
| 5,801,334 A | 9/1998 | Theodorides | |
| 5,878,620 A | 3/1999 | Gilbert et al. | |
| 5,904,984 A | 5/1999 | Smith et al. | |
| 5,938,934 A | 8/1999 | Balogh et al. | |
| 5,982,056 A | 11/1999 | Koyama et al. | |
| 6,015,597 A | 1/2000 | David | |
| 6,048,919 A | 4/2000 | McCullough | |
| 6,069,430 A | 5/2000 | Tsunoda et al. | |
| 6,103,382 A | 8/2000 | Smith et al. | |
| 6,103,882 A | 8/2000 | Masato | |
| 6,130,495 A | 10/2000 | Schulten et al. | |
| 6,130,496 A | 10/2000 | Takigawa et al. | |
| 6,140,590 A | 10/2000 | Baumann et al. | |
| 6,160,042 A | 12/2000 | Ishida | |
| 6,162,849 A | 12/2000 | Zhuo et al. | |
| 6,190,775 B1 | 2/2001 | Smith et al. | |
| 6,238,790 B1 | 5/2001 | Smith et al. | |

(Continued)

FOREIGN PATENT DOCUMENTS

| | | |
|---|---|---|
| DE | 4244298 A1 * | 6/1994 |
| EP | 0-081-154 A1 | 6/1983 |
| EP | 0 157 936 A1 | 10/1985 |
| EP | 0266602 A1 | 5/1988 |
| EP | 0 394 767 A2 | 10/1990 |
| EP | 0 604 804 A2 | 7/1994 |
| EP | 1220240 A1 * | 7/2002 |
| EP | 1 300 439 A1 | 4/2003 |
| EP | 1 383 226 A1 | 1/2004 |
| EP | 1 384 567 A1 | 1/2004 |

(Continued)

OTHER PUBLICATIONS

Tari et al., "Impacts on Turbine Generator Design by the Application of Increased Thermal Conducting Stator Insulation" Cigre SC11-01 Meeting, Paper No. 132 (2002).
Sun et al., "Fundamental Research on Surface Modification of Nano-sized Silica for Underfill Applications" 2004 Electronic Components and Technology Conference (2004).

(Continued)

*Primary Examiner* — Charles Boyer

(57) ABSTRACT

Polymer brushes (50) in a resin that create phonon pathways therein. The polymer brushes themselves comprise structured polymer hairs having a density of 0.8 to 1.0 g/cc, a chain length of 1 to 1000 nm, and a thermal conductivity of 0.5 to 5.0 W/mK. The polymer brushes are 10-25% by volume of the resin, and the polymer hairs can orient surrounding resin molecules to the polymer hairs alignment (55).

17 Claims, 7 Drawing Sheets

U.S. PATENT DOCUMENTS

| | | |
|---|---|---|
| 6,251,978 B1 | 6/2001 | McCullough |
| 6,255,738 B1 | 7/2001 | Distefano et al. |
| 6,261,424 B1 | 7/2001 | Goncharenko et al. |
| 6,261,481 B1 | 7/2001 | Akatsuka et al. |
| 6,265,068 B1 | 7/2001 | David et al. |
| 6,288,341 B1 | 9/2001 | Tsunoda et al. |
| 6,313,219 B1 | 11/2001 | Taylor-Smith |
| 6,344,271 B1 | 2/2002 | Yadav et al. |
| 6,359,232 B1 | 3/2002 | Markovitz et al. |
| 6,369,183 B1 | 4/2002 | Cook et al. |
| 6,384,152 B2 | 5/2002 | Smith et al. |
| 6,393,642 B1 | 5/2002 | Pollman et al. |
| 6,396,864 B1 | 5/2002 | O'Brien et al. |
| 6,426,578 B1 | 7/2002 | Mori et al. |
| 6,432,537 B1 | 8/2002 | Devlin et al. |
| 6,504,102 B2 | 1/2003 | Tsunoda et al. |
| 6,506,331 B2 | 1/2003 | Meguriya |
| 6,509,063 B1 | 1/2003 | McCarthy et al. |
| 6,510,059 B2 | 1/2003 | Mitani et al. |
| 6,548,172 B2 | 4/2003 | David et al. |
| 6,572,937 B2 | 6/2003 | Hakovirta et al. |
| 6,620,497 B2 | 9/2003 | Smith et al. |
| 6,632,561 B1 | 10/2003 | Bauer et al. |
| 6,635,720 B1 | 10/2003 | Tomalia et al. |
| 6,746,758 B2 | 6/2004 | Tsunoda et al. |
| 6,821,672 B2 | 11/2004 | Zguris |
| 6,833,276 B2 | 12/2004 | Klaerner et al. |
| 6,882,094 B2 | 4/2005 | Dimitrijevic et al. |
| 6,905,655 B2 | 6/2005 | Gabriel et al. |
| 6,974,627 B2 | 12/2005 | Morita et al. |
| 7,033,670 B2 * | 4/2006 | Smith ............ 428/413 |
| 7,042,346 B2 | 5/2006 | Paulsen |
| 7,120,993 B2 | 10/2006 | Yamamoto et al. |
| 7,180,409 B2 | 2/2007 | Brey |
| 7,189,778 B2 | 3/2007 | Tobita et al. |
| 7,250,253 B1 | 7/2007 | Klapproth et al. |
| 7,294,788 B2 | 11/2007 | Yoshida et al. |
| 7,425,366 B2 | 9/2008 | Okamoto et al. |
| 7,547,847 B2 | 6/2009 | Miller |
| 2002/0058140 A1 | 5/2002 | Dana et al. |
| 2002/0070621 A1 | 6/2002 | Mori et al. |
| 2002/0098285 A1 | 7/2002 | Hakovirta et al. |
| 2002/0146562 A1 | 10/2002 | Morita et al. |
| 2003/0035960 A1 | 2/2003 | Tsunoda et al. |
| 2003/0040563 A1 | 2/2003 | Sagal et al. |
| 2003/0108879 A1 * | 6/2003 | Klaerner et al. ........ 435/6 |
| 2003/0139510 A1 | 7/2003 | Sagal et al. |
| 2004/0094325 A1 | 5/2004 | Yoshida et al. |
| 2004/0102529 A1 | 5/2004 | Campbell et al. |
| 2004/0102597 A1 | 5/2004 | Tobita et al. |
| 2004/0122153 A1 | 6/2004 | Guo et al. |
| 2004/0152829 A1 | 8/2004 | Tobita et al. |
| 2004/0241439 A1 | 12/2004 | Morita et al. |
| 2005/0010014 A1 * | 1/2005 | Smith ............ 528/106 |
| 2005/0049350 A1 | 3/2005 | Tonapi et al. |
| 2005/0097726 A1 | 5/2005 | Yamamoto et al. |
| 2005/0116336 A1 * | 6/2005 | Chopra et al. ....... 257/720 |
| 2005/0161210 A1 | 7/2005 | Zhong et al. |
| 2005/0208301 A1 | 9/2005 | Okamoto et al. |
| 2005/0236606 A1 | 10/2005 | Toas et al. |
| 2005/0245644 A1 | 11/2005 | Smith et al. |
| 2005/0274450 A1 | 12/2005 | Smith et al. |
| 2005/0274540 A1 | 12/2005 | Smith et al. |
| 2005/0274774 A1 | 12/2005 | Smith et al. |
| 2005/0276977 A1 | 12/2005 | Smith et al. |
| 2005/0277349 A1 | 12/2005 | Smith et al. |
| 2005/0277350 A1 | 12/2005 | Smith et al. |
| 2005/0277351 A1 | 12/2005 | Smith et al. |
| 2005/0277721 A1 | 12/2005 | Smith et al. |
| 2006/0004121 A1 * | 1/2006 | Ding et al. .......... 523/115 |
| 2006/0034787 A1 | 2/2006 | Bujard |
| 2006/0142471 A1 | 6/2006 | Shindo |
| 2006/0231201 A1 | 10/2006 | Smith et al. |
| 2006/0234027 A1 | 10/2006 | Huusken |
| 2006/0234576 A1 | 10/2006 | Smith et al. |
| 2006/0258791 A1 | 11/2006 | Okamoto et al. |
| 2006/0280873 A1 | 12/2006 | Smith et al. |
| 2006/0281380 A1 | 12/2006 | Smith et al. |
| 2006/0281833 A1 | 12/2006 | Smith et al. |
| 2007/0020749 A1 | 1/2007 | Nealey et al. |
| 2007/0026221 A1 | 2/2007 | Stevens et al. |
| 2007/0114704 A1 | 5/2007 | Stevens et al. |
| 2007/0141324 A1 | 6/2007 | Stevens et al. |
| 2007/0222307 A1 | 9/2007 | Sawa et al. |
| 2007/0222308 A1 * | 9/2007 | Yoshida et al. ......... 310/45 |
| 2008/0050580 A1 | 2/2008 | Stevens et al. |
| 2008/0066942 A1 | 3/2008 | Miller |
| 2008/0262128 A1 | 10/2008 | Stevens et al. |
| 2009/0238959 A1 | 9/2009 | Smith et al. |
| 2010/0311936 A1 * | 12/2010 | Smith et al. ........... 528/44 |

FOREIGN PATENT DOCUMENTS

| | | |
|---|---|---|
| EP | 1 486 997 A1 | 12/2004 |
| EP | 1 530 223 A1 | 5/2005 |
| GB | 881036 A2 | 11/1961 |
| JP | 55-053802 | 4/1980 |
| JP | 56029305 | 3/1981 |
| JP | 03205443 A | 9/1991 |
| JP | 06076624 | 3/1994 |
| JP | 06313267 A | 11/1994 |
| JP | 08-020673 | 1/1996 |
| JP | 08-283456 A | 10/1996 |
| JP | 10-088201 | 4/1998 |
| JP | 10-211659 | 8/1998 |
| JP | 2002-212422 | 7/2002 |
| JP | 2002322243 A | 11/2002 |
| JP | 2004243650 A | 2/2004 |
| JP | 2004256687 A | 9/2004 |
| JP | 2005-06389 A | 1/2005 |
| JP | 200506389 A | 1/2005 |
| JP | 2005-199562 A | 7/2005 |
| WO | WO 95/02504 A1 | 1/1995 |
| WO | WO 96/28073 A1 | 9/1996 |
| WO | WO 98/41993 A1 | 9/1998 |
| WO | WO 99/26286 A1 | 5/1999 |
| WO | WO 00/56127 A1 | 9/2000 |
| WO | WO 01/68749 A1 | 9/2001 |
| WO | WO 01/84659 A1 | 11/2001 |
| WO | WO03/040445 A1 | 5/2003 |
| WO | WO 2004/006271 A1 | 1/2004 |
| WO | WO 2004/052999 A2 | 6/2004 |
| WO | WO2004/067606 A1 | 8/2004 |
| WO | WO 2005/069312 | 7/2005 |
| WO | WO 2005/106089 A2 | 11/2005 |
| WO | WO 2005/123825 A2 | 12/2005 |
| WO | WO 2005/124790 A2 | 12/2005 |
| WO | WO 2006/002014 A1 | 1/2006 |
| WO | WO 2006/007385 A1 | 1/2006 |

OTHER PUBLICATIONS

Brutsch et al., "New High Voltage Insulation with Increased Thermal Conductivity" Electrical Electronics Insulation Conference 1993 Proceedings, (Oct. 1993).

Tani et al., "A High Voltage System with Increased Thermal Conductivity for Turbo Generators" Coil Winding, Insulation and Electrical Manufacturing Conference (2001).

Von Roll Isola, "Mica Tapes," product literature, 381.58, date unknown.

Tomoyuki Matsumura "Phase Structures and Thermal and Conductive Properties of Epoxy-Alumina Hybrids Filled with Conductive Fillers," STN Database No. 2002:257918, Apr. 8, 2002, Abstract pp. 1-2; XP-002356007.

Derwent Acc-No. 1980-39239C (JP 55053802 A Derwent Abstract) (Nippon Mica Seisaku) 1978.

Product Data Sheet for Polar Therm Boron Nitride Powder Grades PT120, PT140, PT160, and PT180, provided by Momentive Performance Materials (2007).

POSS® Enhanced Thermosets, Product Brochure from Hybrid Products, Inc., date unknown.

Production Information Sheet for D.E.R.™ 330 (Liquid Epoxy Resin) from The Dow Chemical Co., date unknown.

Yasufumi Shibata; Takenobu Sakai; Shingo Katayama; Noriko Yamada; "Lipophilic inorganic-organic hybrid materials with low frictional coefficient useful for sliding parts such as piston rings"; retrieved from STN database accession No. 2002:568167: Jul. 31, 2002; Abstract pp. 1-3; XP-002355912.

Derwent Abstract of EP-0-081-154 A1.

Machine Translation of JP-08-283456A, provided by the JPO website (no. date).

Yasufumi Shibata, "Lipophillic Inorganic-Organic Fillers with Low Frictional Coefficient," STN Database No. 2002:568167, Jul. 31, 2002, Abstract pp. 1-3; XP-002355912.

JP 2004256687 A English Abstract.

JP 2004256687 A Partial English Translation (4 pages).

* cited by examiner

POLYMER BRUSHES

CROSS-REFERENCE TO RELATED APPLICATIONS

This invention is a Continuation in Part of U.S. application Ser. No. 11/152,983 "HTC Materials Incorporated into Resins," by Smith, et al., which is incorporated herein by reference.

FIELD OF THE INVENTION

The field of the invention relates to high thermal conductivity materials impregnated into highly structured resins.

BACKGROUND OF THE INVENTION

With the use of any form of electrical appliance, there is a need to electrically insulate conductors. With the push to continuously reduce the size and to streamline all electrical and electronic systems there is a corresponding need to find better and more compact insulators and insulation systems.

Various epoxy resin materials have been used extensively in electrical insulation systems due to their practical benefit of being tough and flexible electrical insulation materials that can be easily adhered to surfaces. Traditional electrical insulation materials, such as mica flake and glass fiber, can be surface coated and bonded with these epoxy resins, to produce composite materials with increased mechanical strength, chemical resistance and electrical insulating properties. In many cases epoxy resins have replaced traditional varnishes despite such materials having continued use in some high voltage electrical equipment.

Good electrical insulators, by their very nature, also tend to be good thermal insulators, which is undesirable. Thermal insulating behavior, particularly for air-cooled electrical equipment and components, reduces the efficiency and durability of the components as well as the equipment as a whole. It is desirable to produce electrical insulation systems having maximum electrical insulation and minimal thermal insulation characteristics.

Electrical insulation often appears in the form of insulating tapes, which themselves have various layers. Common to these types of tapes is a paper layer that is bonded at an interface to a fiber layer, both layers tending to be impregnated with a resin. A favored type of insulation material is a mica-tape. Improvements to mica tapes include catalyzed mica tapes as taught in U.S. Pat. No. 6,103,882. The mica-tape may be wound around conductors to provide extremely good electrical insulation. An example of this is shown in FIG. 1. Illustrated here is a coil 13, comprising a plurality of turns of conductors 14, which in the example illustrated here are assembled into a bakelized coil. The turn insulation 15 is prepared from a fibrous material, for example glass or glass and Dacron which is heat treated. Ground insulation for the coil is provided by wrapping one or more layers of composite mica tape 16 about the bakelized coil 14. Such composite tape may be a paper or felt of small mica flakes combined with a pliable backing sheet 18 of, for example, glass fiber cloth or polyethylene glycol terephthalate mat, the layer of mica 20 being bonded thereto by a liquid resinous binder. Generally, a plurality of layers of the composite tape 16 are wrapped about the coil depending upon voltage requirements. A wrapping of an outer tape 21 of a tough fibrous material, for example, glass fiber, may be applied to the coil.

Generally, multiple layers of the mica tape 16 are wrapped about the coil with sixteen or more layers generally being used for high voltage coils. Resins are then impregnated into the tape layers. Resins can even be used as insulation independently from the insulating tape. Unfortunately this amount of insulation only further adds to the complications of dissipating heat. What is needed is electrical insulation that can conduct heat higher than that of conventional methods, but that does not compromise the electrical insulation and other performance factors including thermal and mechanical capabilities.

Other difficulties with the prior art also exist, some of which will be apparent upon further reading.

SUMMARY OF THE INVENTION

With the foregoing in mind, methods and apparatuses consistent with the present invention, facilitate the transport of phonons through a high thermal conductivity (HTC) impregnated medium to reduce the mean distances between the HTC materials below that of the phonon mean free path length This reduces the phonon scattering and produces a greater net flow or flux of phonons away from the heat source. The resins may then be impregnated into a host matrix medium, such as a multi-layered insulating tape.

These and other objects, features, and advantages in accordance with the present invention are provided particular embodiments by a resin that comprises polymer brushes. The polymer brushes themselves comprise structured polymer chains forming hair-like structures having a density of 0.8 to 1.0 g/cc, a chain length of 1 to 1000 nm, and in particular 2 to 100 nm, and a thermal conductivity of 0.5 to 5.0 W/mK. In an aspect of the invention, the polymer hairs are configured to be sufficiently rigid for ordering the polymer hairs at these densities and chain lengths effective to reduce entanglements. The polymer brushes may be 10-25% by volume of the resin, and the polymer hairs orient surrounding resin molecules to the polymer hairs alignment. This arrangement creates phonon pathways within the resin. In some embodiments the polymer brushes are formed after the resin is, impregnated into a porous media, which may be a paper matrix such as a mica-glass insulating paper In an embodiment the polymer brushes are created an on the surface of a substrate, and may be formed from vinyl or vinyl-epoxy monomers. The polymer brushes may also be formed from liquid crystal epoxy.

In another embodiment filler materials are added to the resin, and the filler materials comprise 5-40% by volume of the highly structured resin and the filler materials have aspect ratios of 3-100.

In another embodiment the resin is an epoxy resin. In yet another embodiment, the resin may be a hydrocarbon, such as polybutadiene, polysiloxanes, aromatic polyesters and/or aromatic polyamides.

In another embodiment, the present invention provides for an epoxy resin that comprises filler materials and polymer brushes, where the polymer bushes brushes bridge the filler materials within the epoxy resin. The filler materials themselves comprises 5-40% by volume of the highly structured resin and have aspect ratios of 3-100. The filler materials also form a continuous organic-inorganic composite with the epoxy resin and the polymer brushes. The polymer brushes comprise 10-25% by volume of the epoxy resin, and the bridged filler materials create phonon channels within the epoxy resin.

In particular embodiments, the epoxy resin is selected from at least one of liquid crystal polymers, interpenetrating networks, polymer brush type matrices, expanding polymers, ladder polymers, star polymers and structured organic-inorganic hybrids. In other particular embodiments the filler materials comprise one or more of Al2O3, AlN, MgO, ZnO, BeO, BN, Si3N4, SiC and SiO2.

Other embodiments of the present invention also exist, which will be apparent upon further reading of the detailed description.

BRIEF DESCRIPTION OF THE FIGURES

The invention is explained in more detail by way of example with reference to the following drawings.

DETAILED DESCRIPTION OF THE INVENTION

Figure 1:
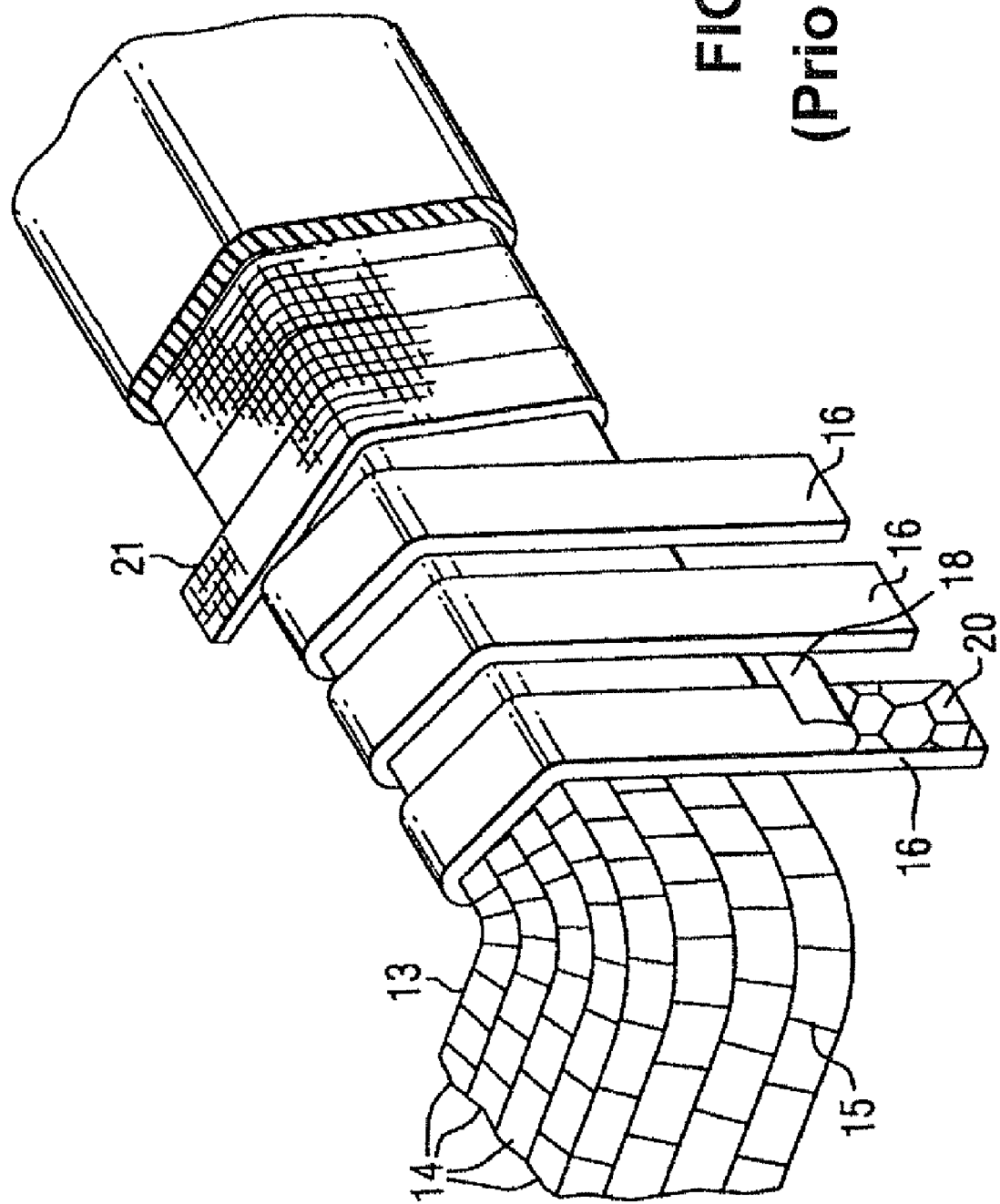
FIG. 1 shows the use of an insulating tape being lapped around a stator coil.

High thermal conductivity (HTC) composites comprise a resinous host network combined with fillers that are two phase organic-inorganic hybrid materials. The organic-inorganic hybrid materials are formed from two phase organic-inorganic composites, from organic-inorganic continuous phase materials that are based on molecular alloys, and from discrete organic-polymer brush composites in which the organic-inorganic interface is non-discrete with the polymer brush branched brush structure. Phonon transport is enhanced and phonon scattering is reduced by ensuring the length scales of the structural elements are shorter than or commensurate with the phonon distribution responsible for thermal transport.

Two phase organic-inorganic hybrids may be formed by incorporating inorganic micro, meso or nano-particles in linear or cross linked polymers (thermoplastics) and thermosetting resins. Host networks include polymers and other types of resins, definitions of which are given below. In general, the resin that acts as a host network may be any resin that is compatible with the particles and, if required, is able to react with the groups introduced at the surface of the filler. Nanoparticle dimensions are typically of the order of or less than the polymer network segmental length. For example 1-30 nm. The inorganic particles contain reactive surfaces to form covalently bonded hybrid organic-inorganic homogeneous materials. The particles may be oxides, nitrides, carbides and hybrid stoichiometric and non-stoichiometric mixes of the oxides, nitrides and carbides, more examples of which are given below.

The inorganic particles are surface treated to introduce a variety of surface functional groups which are capable of participating in reactions with the host network. The surface functional groups include but are not limited to hydroxyl, carboxylic, amine, epoxide, silane and vinyl groups. The groups may be applied using wet chemical methods, non-equilibrium plasma methods, chemical vapor and physical vapor deposition, laser beams, sputter ion plating and electron and ion beam evaporation methods.

The discrete organic-polymer brush composites may be reacted together or with the resin matrix to form a single material. The surface of the polymer brush can contain reactive groups similar to those mentioned above, which will either allow polymer brush-polymer brush or polymer brush-organic matrix reactions to occur. The polymer brush will have an inorganic handle and an organic hair containing the reactive groups of interest. It may also be possible to have an organic handle with an inorganic hair which also contains reactive groups such as hydroxyl or amino, carboxyl thiol, amide, cyanate, thiocyanate, isocyanate and isothio cyanate groups, silane, or a combination thereof groupings which can participate in inorganic reactions similar to those involved in common sol-gel chemistries. A third possibility is polymer brush with both an organic handle and organic hair.

In regards to the use of non-discrete organic-inorganic hybrids it is possible to use sol-gel chemistry to form a continuous molecular alloy. Gel sol-chemistries involving aqueous and non-aqueous reactions may be used. Other compounds for the formation of organic-inorganic hybrids include the polyhedral oligomeric silsesquioxanes (POSS), tetraethyl orthosilicate (TEOS) and tetrabutyl orthotitanate (TBOT) and related monomeric and oligomeric hybrid compounds which are organic functionalized inorganic compounds. In the example of POSS, molecules are built around a building block of R—$SiO_{1.5}$ in which the R group is chosen to compatibilize with and/or react with other organic compounds and the host network. The base compounds may be combined to yield larger molecules commensurate with the size of polymer segment and coil structures. POSS may be used to create organic-inorganic hybrids and may be grafted into existing polymers and networks to control properties, including thermal conductivity. The materials may be obtained from suppliers such as Aldrich™ Chemical Co., Hybrid Plastics™ Inc. and Gelest™ Inc.

As mentioned, it is important to control the structural form of the materials to reduce phonon scattering. This can be further assisted by using nano-particles whose matrices are known to exhibit high thermal conductivity and to ensure that the particles size and its interfacial characteristics with the resin are sufficient to sustain this effect, and also to satisfy the length scale requirement to reduce phonon scattering. A choice of structures that are more highly ordered will also benefit this, including reacted polymer brush lattices having both short and longer range periodicity and ladder or ordered network structures that may be formed from a host resin, such as liquid crystal epoxies and polybutadienes.

The filled resins may be used as bonding resins in a variety of industries such as circuit boards and insulating tapes. A particular kind of insulating tape is the mica-glass tape used in the electrical generator fields. Resins with these types of tapes can be used as bonding resins, or as impregnating resins as is known in the art. The filled resin may also be used in the electrical generator field without the tapes to fulfill electrical insulation applications in the rotating and static electrical equipment components.

The tapes may be impregnated with resin before or after being applied to electrical objects. Resin impregnation techniques include VPI and GVPI, discussed more below. In VPI, once a tape is lapped and impregnated it is compressed. Once in position, the resin in the compressed tape is cured, which effectively locks the position of the HTC materials. In some embodiments the resin is cured in a two stage process, as will be apparent to one of ordinary skill in the art. However, optimal compression of the loaded HTC materials favors a completely uncured resin during the compression stage.

Figure 2:
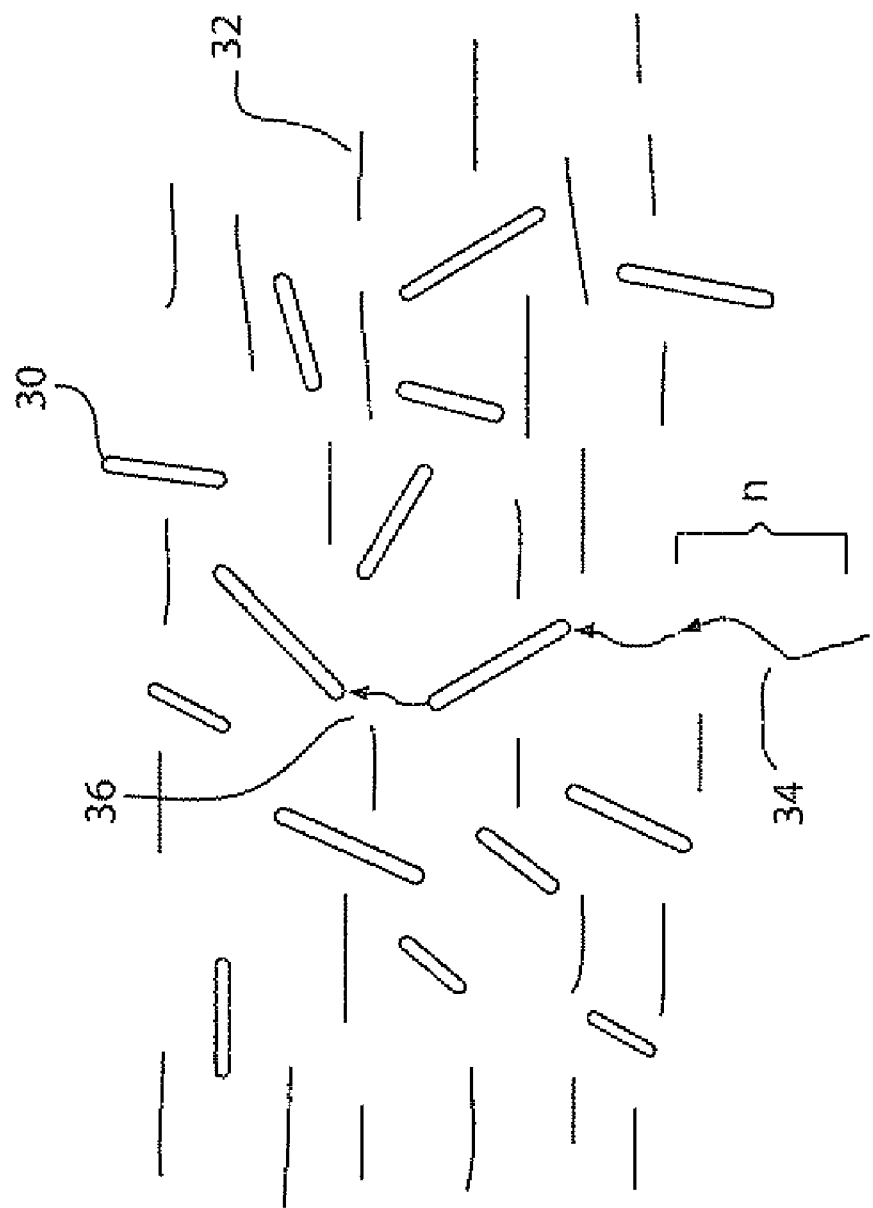
FIG. 2 illustrates phonons traveling through a loaded resin of the present invention.

FIG. 2 shows one embodiment of the present invention. Illustrated here are HTC materials 30 loaded into a resinous matrix 32. Phonons 34 traveling through the matrix have a mean path length n, this is the phonon mean free path. This path length can vary depending on the exact composition of the resin matrix, but is generally from 2 to 100 nm, and more typically 5-50 nm, for resins such as epoxy resins. Therefore the mean distance between the loaded HTC materials should be on average less than this distance. Note that the distance between the HTC materials can vary in the thickness versus transverse direction of the tape, and it is generally the thickness direction where the spacing needs to be optimized.

As phonons 34 travel through the resin 32 they will tend to pass along the embedded HTC materials 30. This will increase the local phonon flux since the raw HTC materials will have a thermal conductivity of between 10-1000 W/mK, as opposed to the resin which is about 0.1-0.5 W/mK. As phonons pass along a loaded HTC material the phonons 36 pass to the next HTC material if the distance between the materials is less than n, therefore the HTC materials form an interconnecting network. FIG. 2 illustrates an idealized path. In practice there will be phonon scattering as the phonons pass between the resin and HTC materials, although the shorter the distance between the materials, and the better the match of phonon propagation characteristics between the HTC materials and the resin, the less the scattering.

The amount of HTC materials loaded in the resin could actually be quite low, for example about 10% as illustrated in FIG. 2. The average distances, or length scales, between loaded HTC materials therefore may be slightly greater than n, however, a large percentage will still be less than n and therefore fall within embodiments of the present invention. In particular embodiment, the percentage materials that are less than n distance from the next HTC material is over 50%, with particular embodiment being over 75%. In particular embodiment the average length of the HTC materials is greater than n, which further aids in phonon transport.

The shorter n the greater the concentration of loaded HTC materials, and conversely, the greater the particle size, the less HTC materials needed. Particular embodiment use 5-60% loaded HTC materials by total volume of the resins and fillers, with more particular embodiments at 5-40%. When the resin is impregnated into the tape, it will fill up the spaces between the tape fibers and substrates. The HTC distribution within the tape at this point, however, is often not optimized, and can even have the mean distance between HTC materials greater than n. Practice of the present invention then compresses the resin impregnated tapes and reduces the distances between the loaded HTC materials.

When a loaded resin is being impregnated into a tape, the fibers or particles of the tape act to block some of the HTC materials, particularly if the resin is 30% or more filler. However, by compressing the tapes, the reverse happens, and more fillers are trapped within the tape as the HTC materials attach themselves to non-mobile parts of the overall structure. The HTC fillers even get pinned to one another. In the embodiments given, it has been implied that the fillers do not react with the resin matrix, however, in some embodiments the fillers do form covalent bonds with the resin and form more homogeneous matrixes. In a homogenous matrix, the resin molecules that are bound to fillers will be retained better than the unbound resin molecules during compression.

Resins are used in a plurality of industries, and have a large number of uses. Different properties of the resins affect not only their uses, but also the quality and efficiency of the products that they are used with. For example, when resins are used in electrical insulation applications, their characteristics of dielectric strength and voltage endurance needs to be high, as does the thermal stability and thermal endurance. However, often contrary to these objectives, resins usually will also have a low thermal conductivity. The present invention balances the various physical properties of resins and the insulation system they are introduced into to produce a system that has a higher thermal conductivity than conventional electrically insulating materials while maintaining adequate, and even enhancing, key physical properties such as dielectric strength, voltage endurance, thermal stability and thermal endurance, mechanical strength and viscoelastic response.

As used herein, the term resin refers to all resins and epoxy resins, including modified epoxies, polyesters, polyurethanes, polyimides, polyesterimides, polyetherimides, bismaleimides, silicones, polysiloxanes, polybutadienes, cyanate esters, hydrocarbons etc. as well as homogeneous blends of these resins. This definition of resins includes additives such as cross-linking agents, accelerators and other catalysts and processing aids. Certain resins, such as liquid crystal thermosets (LCT) and 1,2 vinyl polybutadiene combine low molecular weights characteristics with good crosslinking properties. The resins can be of an organic matrix, such as hydrocarbons with and without hetero atoms, an inorganic matrix, containing silicate and/or alumino silicate components, and a mixture of an organic and inorganic matrix. Examples of an organic matrix include polymers or reactive thermosetting resins, which if required can react with the reactive groups introduced on inorganic particle surfaces. Cross-linking agents can also be added to the resins to manipulate the structure and segmental length distribution of the final crosslinked network, which can have a positive effect on thermal conductivity.

The present invention uses polymer brushes as part of the resin composition. Polymer brush ordinarily refers to molecular array assemblies with chemical structures similar to that of host resins (see above) comprising chains of polymers that are attached to the surface of a substrate, particle surface, or in some cases, polymers that are attached to other polymers. A plurality of the polymers form the hairs, or the brush part of the polymer brush, while a substrate or a single, but usually longer, polymer of a different type will form the handle. The brush contains functional groups such as hydroxyl, amino, carboxyl, thiol, amide, cyanate, thiocyanate, isocyanate and isothio cyanate groups, silane, or a combination thereof. A polymer brush is capable of supporting macromolecular array synthesis comprising covalently linked monomers having, with chemistries similar to those mentioned above, for example hydroxyl, amino, sulfydryl or carboxyl groups or any combination thereof may be formed, and provide attachment points.

Depending on use, the brushes may start as a whole brush ready for reaction, as individual polymers that are assembled during a process, or combinations thereof. If a resin is being impregnated, the polymerization, ie brush formation, can be done after impregnation, and initiated from the surface. In particular embodiments, the polymer brushes are synthesized first and then added to the rest of the resin, such as a micabond and/or VPI resin used during the manufacture of generator coils discussed above. In such a case the various polymer hairs find reactive sites on a substrate and form the brush. In other embodiments, the polymer brushes are made directly onto a substrate, such as the mica particles in an insulation tape.

Figure 3:
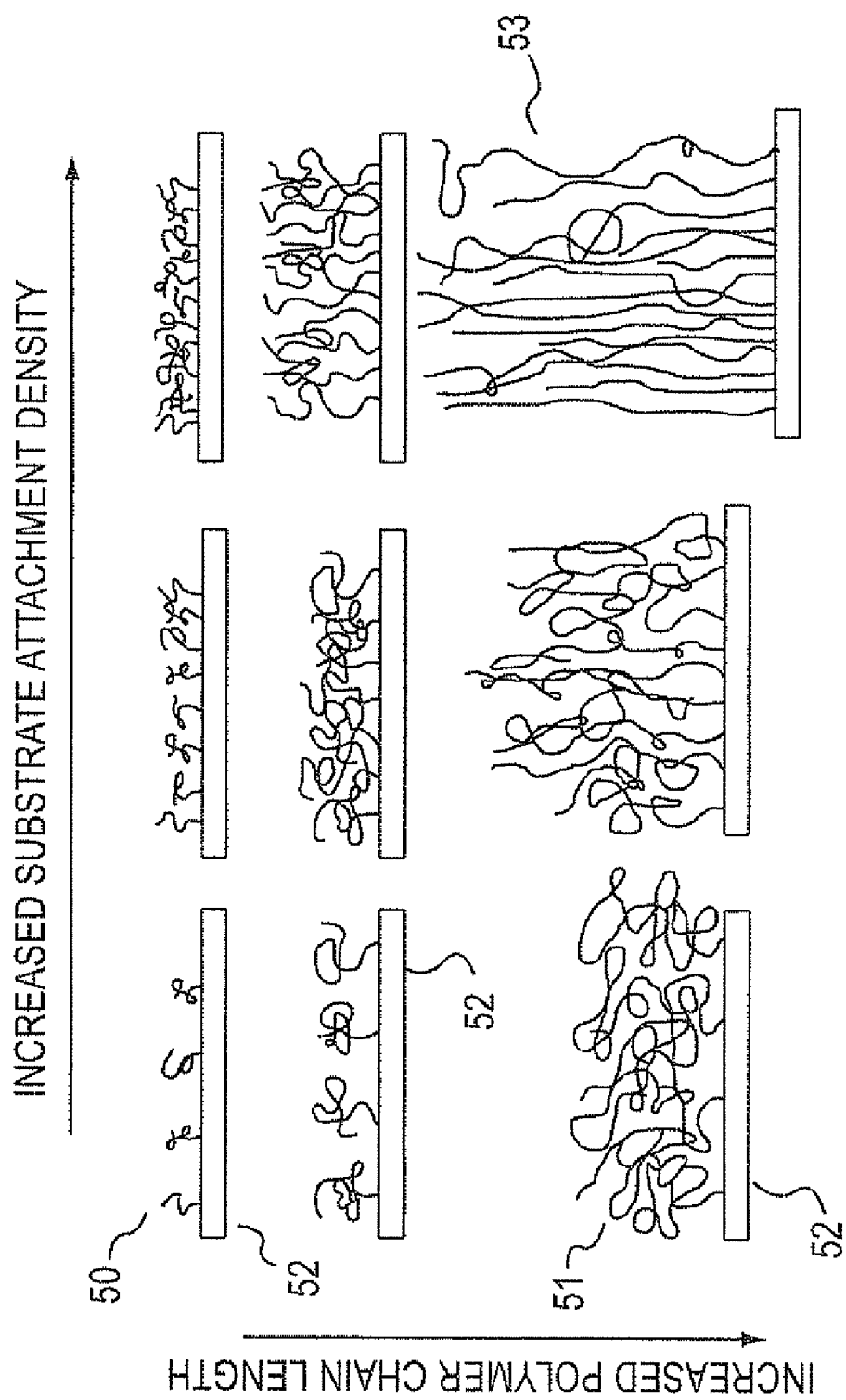
FIG. 3 illustrates the relationship between increasing polymer chain length and increased substrate attachment density for a conventional polymer brush with variable thermal conductivity.

In order to increase the thermal conductivity, the present invention increases the order and density of the polymer brushes. This runs contrary to conventional polymer brushes in which increasing polymer density on a substrate increases the disorder of the hairs due to the Gaussian entanglements of the molecular segments. This is seen if FIG. 3, where when the polymer hairs 50 are attached to a substrate 52, the Gaussian entanglements increase as the chain length increases 51. This type of polymer brush, shown in FIG. 3, would not be expected to exhibit high thermal conductivity because of the Gaussian entanglements Generally in the prior art, as the number of polymer hairs in a given area increase the chain entanglements even more severely as the hair lengths become longer. However, referring to FIG. 3 and FIG. 4, the present invention increases the polymer brush ordering as the polymer hair 50 density increases. Even the longer hairs maintain a rigid order as the density is increased 51. In fact, the longer chains 53 can create areas of higher density than the shorter chains, which will result in better matching of interfaces and reduce phonon scattering. In order to prevent Gaussian entanglements, the present invention uses hairs that are of a more rigid structure. Particular types of polymer hairs that are more rigid are LCT epoxies such as, for example, Diglycidylether of 4,4'-Biphenol, and 1.2 vinyl polybutadienes.

Figure 4:
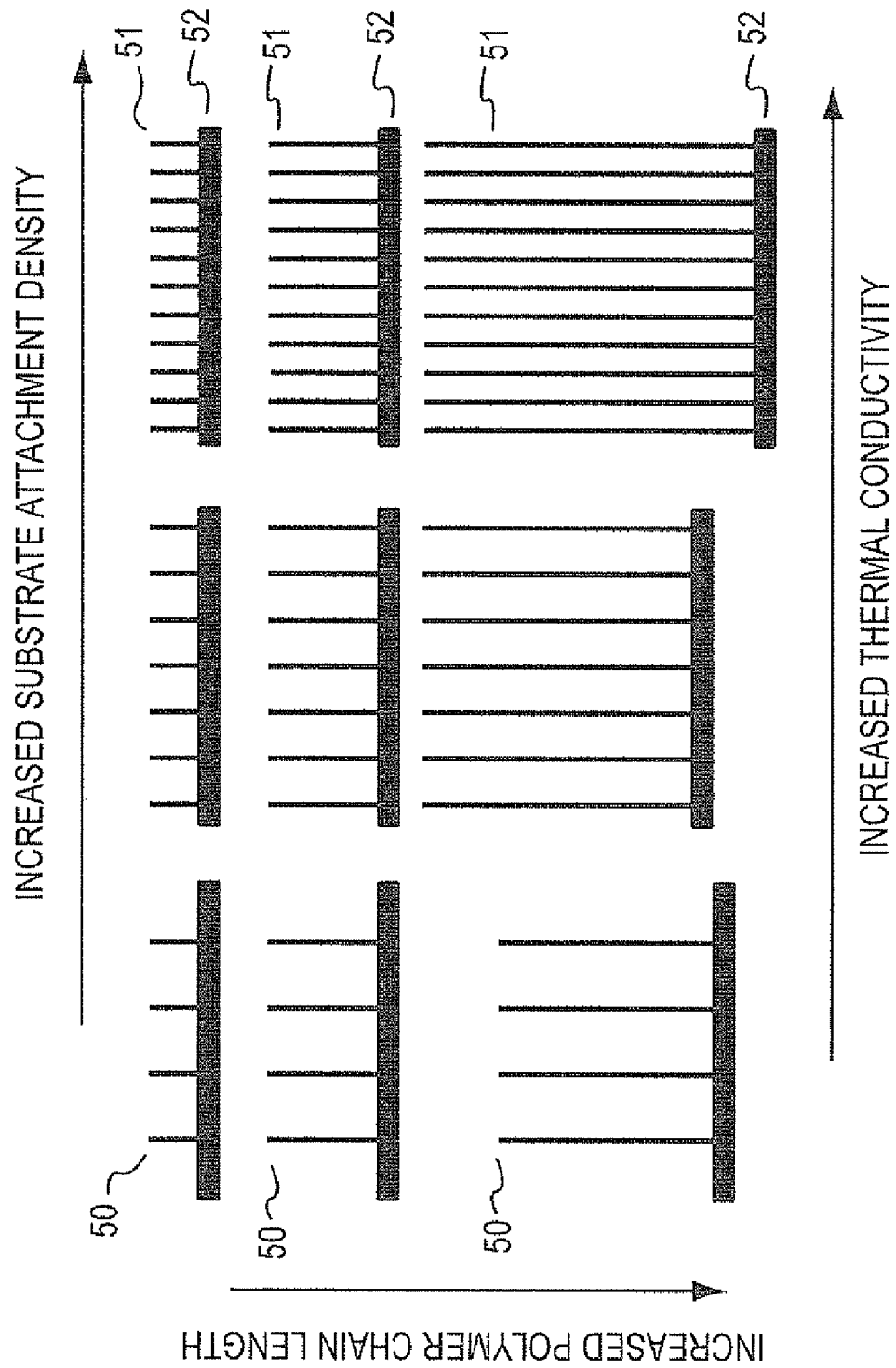
FIG. 4 illustrates the relationship between increasing polymer chain length and increased substrate attachment density to achieve an increasing thermal conductivity of polymer brushes.
Figure 5:
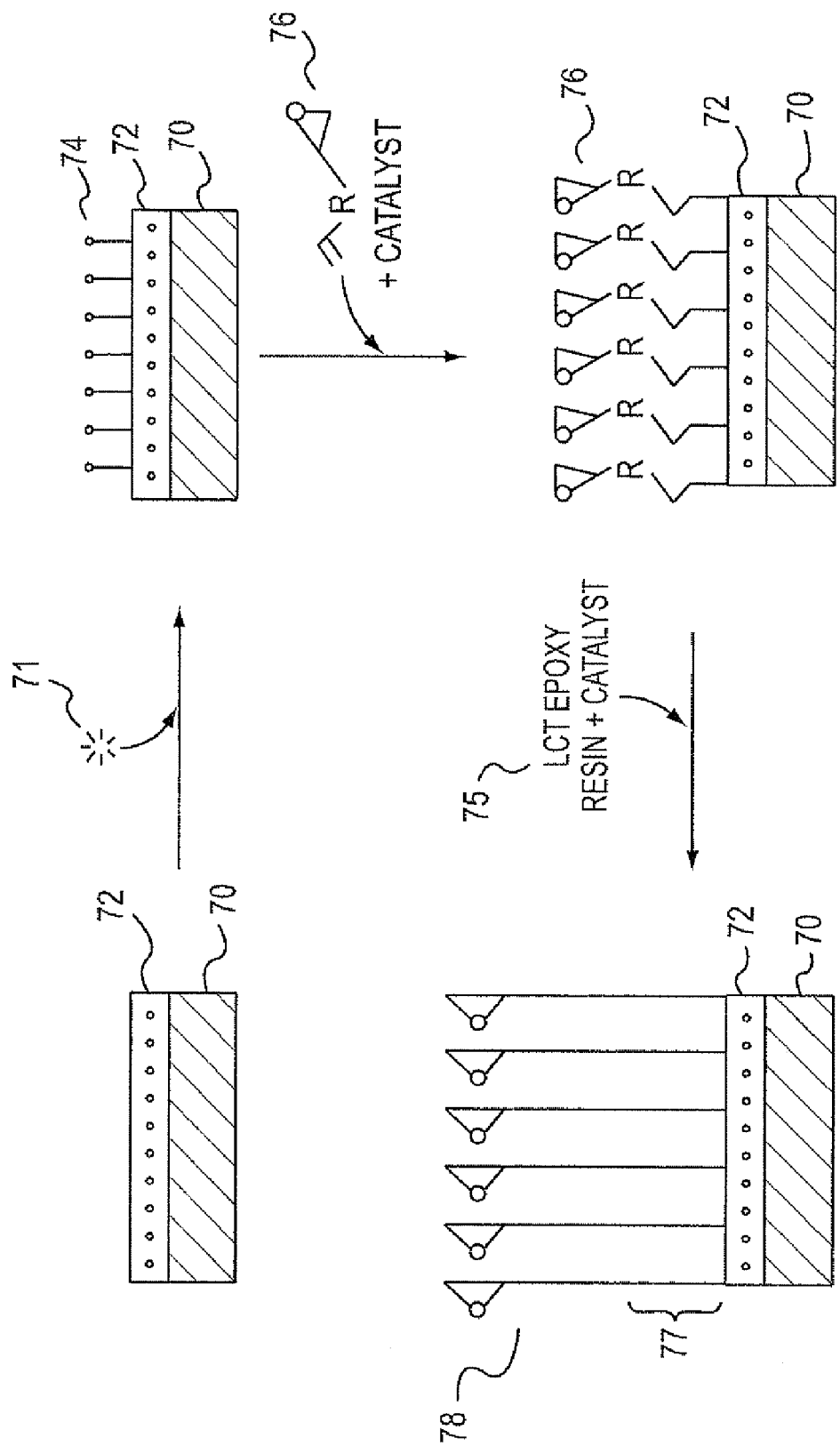
FIG. 5 illustrates one example of a reaction forming a high thermal conductivity polymer brushes on a substrate

Referring more specifically to FIG. 4 the present invention increases the polymer brush ordering as the polymer hair 50 density increases. Even the longer hairs maintain a rigid order as the density is increased 51. In fact, the longer chains can create areas of higher density than the shorter chains, which will result in better matching of interfaces and reduce phonon scattering. In order to prevent Gaussian entanglements, the present invention uses hairs that are of a more rigid structure Referring to FIG. 5, an example of how polymer brushes of the present invention are formed is shown. A base layer 70, such as a substrate, has an initiator layer 72 thereupon. An energy source 71, such as heat or light, creates surface bound free radicals 74 on the initiator layer 72. An epoxy-vinyl monomer is then added 76, creating an epoxy-vinyl monomer polymer layer 77. To this is added 75 an epoxy resin, such as an LCT epoxy, creating epoxy brush hairs 78. Examples of substrates include alumina, silica, boron nitride, polymer (e.g., polycarbonate, polyimide), and mica or glass fibers. Examples of free radical initiators include (for substrate treatment) water soluble azonitrile compounds such as VA-044 available from Wako Chemicals and DuPont. Examples of monomer polymerization catalysts are benzoyl peroxide, t-butyl peroxide, MEK peroxide. Cumene hydroperoxide is available from Arkema Chemicals and the Chemtura Corporation. Examples of epoxy functionalized vinyl monomers are p-vinylphenyl glycidyl ether (VPGE) and p-isoprope-nylphenyl glycidyl ether (IPGE). Examples of epoxy curing catalyst include (B-staging) dicyandiamide, diaminodiphenyl sulfone (DOS), Benzyldimethylamine (BDMA). In the example given in FIG. 5, the prepared polymer brush may not be fully cured after preparation (i.e., B-staged with residual unreacted epoxy and hydroxyl groups), so that it may be reacted at some later time with micabond resins and impregnating resins. The amount of B-staging catalyst and the optimum reaction temperature would be carefully selected to allow this B-stage condition to be achieved.

Figure 6:
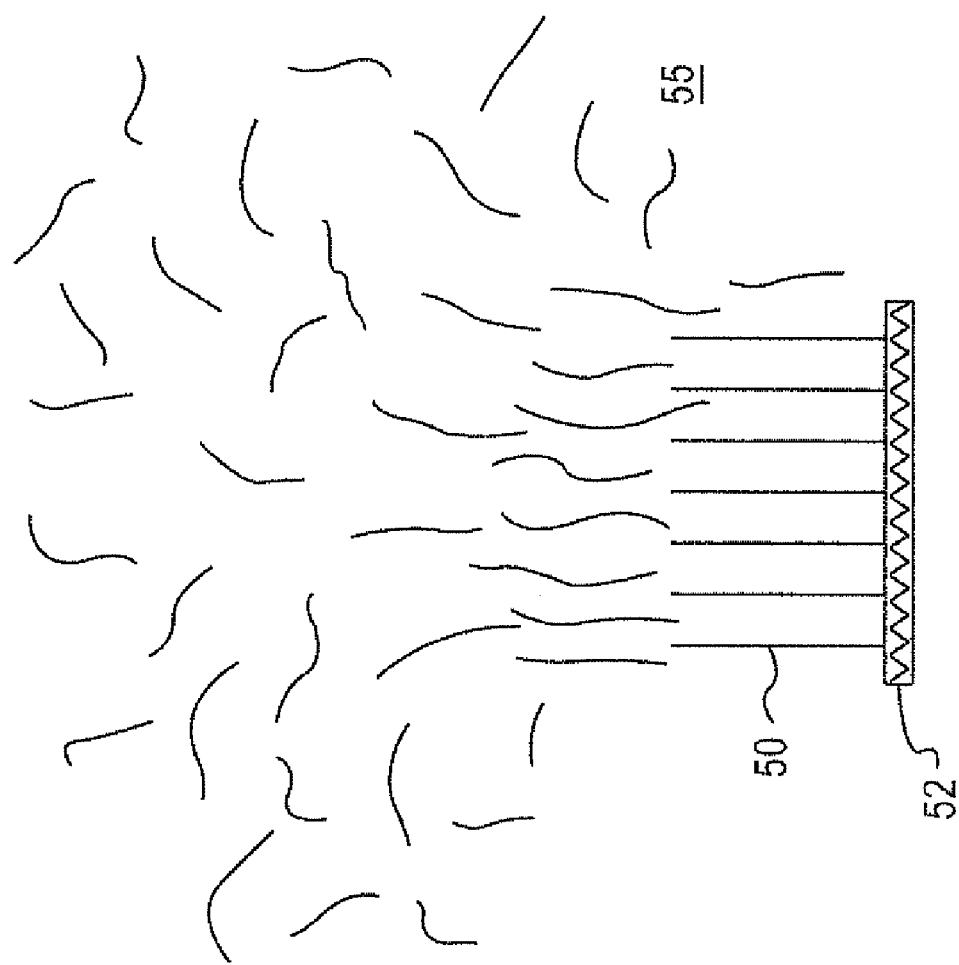
FIG. 6 illustrates structural ordering around a high thermal conductivity polymer brush with an effect on surrounding resin molecules.

Unlike the disordered polymer brushes of the prior art that would not increase the thermal conductivity of the resin component, the ordered polymer brushes will significantly increase the thermal conductivity through and around the affixed substrates. In addition, as seen in FIG. 6, the ordered polymer brushes 50, can impart increased order on the resin around them 55. This has the effect of magnifying the ordered region and further increasing thermal conductivity around the substrate 52. As discussed below, the terminal ends of the hairs can have particular function groups that can react to the resin matrices to further lock in this ordering.

Polymer brush type resin matrices shown above are a fraction of the total resin used, and will typically be from 10-25% of the resin by volume. This lower percentage will allow the bulk of the resin to maintain its recognized properties, such as impregnability, wettablility, etc, while still allowing the polymer brushes to increase thermal conductivity around a substrate. However, in some embodiment the polymer brushes can make up the entire resin matrices. A resin matrix of the prior art will have a maximum thermal conductivity of about 0.15 W/mK. The present invention provides resins with a thermal conductivity of 0.5 to 5 W/mK and even greater.

The polymer brushes comprises a handle, which is often a substrate, and hairs or repeating units connected to the handle, which may have distinct terminal moieties. A polymer brush can be defined into a multitude of structures by fine tuning the architectural components. The ends of the polymer brush can be composed of a large number of functional groups which can be reacted with other polymer species to give unusual copolymer structures. These functional groups include amino, hydroxyl and carboxyl which would be reactive with resins such as the LCT epoxies. Specific types of polymer brushes include polypropylene-imine, polyamido-amine, and polyamido-amines with an organic silicon exterior These types of polymers can also form inorganic networks with the inclusion of inorganic fillers.

Although the polymer brushes may make up the entire host resin structure, it is more often the case that they are a part of the resin that comprises different types of molecules. Particular types of resin, such as Micalastic and Thermalastic resins, are particularly well suited for mixing with the polymer brushes. In addition more highly structured resins, such as liquid crystal thermosets (LCT) and 1,2 vinyl polybutadiene are also good since they combine low molecular weights characteristics with good crosslinking properties. Highly structured resins, form highly organised micro-structures both prior to and during crosslinking when cured. The structures include crystallinity, para-crystallinity and liquid crystalline structures, unique polymer architectures, controlled crosslinking and network expansion and contraction during cure. The use of highly structured resins enhances the HTC properties, particularly the heat conductivity, and can achieve significant enhancement to electrical and mechanical properties The polymer brushes may also have mixed macromolecular arrays, which allows for switching and/or self-assembling properties such as wettability, porosity and adhesion.

When the high thermal conductivity fillers are homogeneously mixed with resins containing the polymer brushes (or brushes are formed after mixing) they form a continuous product, in that there is no interface between the resins and the fillers, and covalent bonds are formed between the fillers and the polymer brushes.

When the HTC materials form essentially homogenous mixtures with the resins, they are essentially free of undesired microscopic interfaces, variable particle wetting and micro void formation. These homogeneous materials form a continuous-phase material which are non-discrete at length scales shorter than either the phonon wavelength or phonon mean free path in conventional electrical insulating materials. In some embodiments, intentional interfaces can be placed in the resin structure so as to control dielectric breakdown. In insulating materials, dielectric breakdown will occur given the right conditions. By controlling the nature and spatial distribution of the interfaces in two-phase system, dielectric breakdown strength and long term electrical endurance can be enhanced. Increases in dielectric strength will take place in part because of increased densification, the removal of micro voids and a higher level of internal mechanical compression strength.

Generally, the larger the polymer brush, the greater its ability to function as a phonon transport element. However, its ability to permeate the material and its percolation potential can be adversely affected by its size so optimal sizes are sought to achieve the balance of structure and properties required. Like other HTC materials, solvents can be added to the polymer brushes so as to aid in their impregnation of a substrate, such as a mica or a glass tape.

In all cases phonon transport is enhanced and phonon scattering reduced by ensuring the length scales of the structural elements are shorter than or commensurate with the phonon distribution responsible for thermal transport. Larger HTC particulate materials can actually increase phonon transport in their own right, however, smaller HTC materials can alter the nature of the resin matrix, thereby affect a change on the phonon scattering. This may be further assisted by using nano-particles whose matrices are known to exhibit high thermal conductivity and to ensure that the particle size and interface characteristics are sufficient to sustain this effect and also to satisfy the length scale requirements for reduced phonon scattering.

Continuous organic-inorganic hybrids may be formed by incorporating inorganic nano-particles in linear or crosslinked polymers and thermosetting resins in which nano-particles dimensions are of the order of or less than the polymer or network segmental length (typically 1 to 50 nm). This would include, but is not exclusive to three routes or mechanisms by which this can occur (i) side chain grafting, (ii) inclusive grafting e.g. between two polymer chain ends, (iii) cross-link grafting involving at least two and typically several polymer molecules.

These inorganic nano-particles will contain reactive surfaces to form intimate covalently bonded hybrid organic-inorganic homogeneous materials. These nano-particles may be metal oxides, metal nitrides, and metal carbides, as well as some non-metal oxides, nitrides and carbides. For example, alumina, magnesium oxide and zinc oxide and other metal oxides, boron nitride and aluminum nitride and other metal nitrides, silicon carbide and other carbides, diamond of natural or synthetic origin, and any of the various physical forms of each type and other metal carbides and hybrid stoichiometric and non-stoichiometric mixed oxides, nitrides and carbides. More specific examples of these include $Al_2O_3$, AlN, MgO, ZnO, BeO, BN, $Si_3N_4$, SiC and $SiO_2$ with mixed stoichiometric and non-stoichiometric combinations.

The volume percentage of the HTC materials in the resin may be up to approximately 60% or more by volume, and more particularly up to approximately 35% by volume. Higher volume filling tends to give higher structural stability to a matrix. However, with control of the size and shape distribution, degree of particle association and alignment the HTC materials can occupy as little as 1% by volume or less. Although, for structural stability reasons, it might be useful to add an amount greater than the minimum needed for percolation to occur. Therefore the resin can withstand physical strains and deformation without damaging the percolation structure and the HTC characteristics.

The addition of surface functional groups may include hydroxyl, carboxylic, amine, epoxide, silane or vinyl groups which will be available for chemical reaction with the host organic polymer or network forming resin system. These functional groups may be naturally present on the surface of inorganic fillers or they may be applied using wet chemical methods, non-equilibrium plasma deposition including plasma polymerization, chemical vapour and physical vapour deposition, laser beams, sputter ion plating and electron and ion beam evaporation methods. The matrix polymer or reactive resin may be any system which is compatible with the nano-particles and, if required, is able to react with the reactive groups introduced at the nano-particle surface. These may be epoxy, polyimide epoxy, liquid crystal epoxy, cyanate-ester and other low molecular weight polymers and resins with a variety of crosslinking agents.

Figure 7:
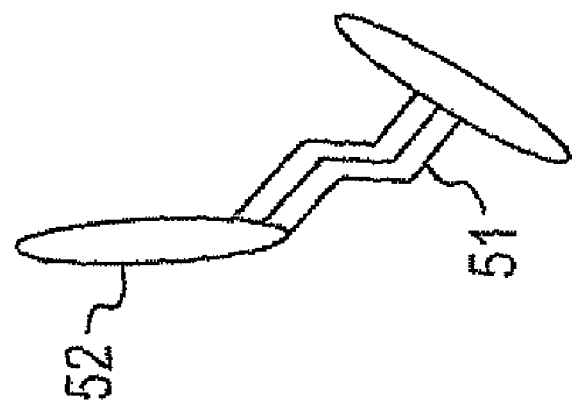
FIG. 7 illustrates a bridging of particles by high thermal conductivity polymer brushes.
Figure 7:
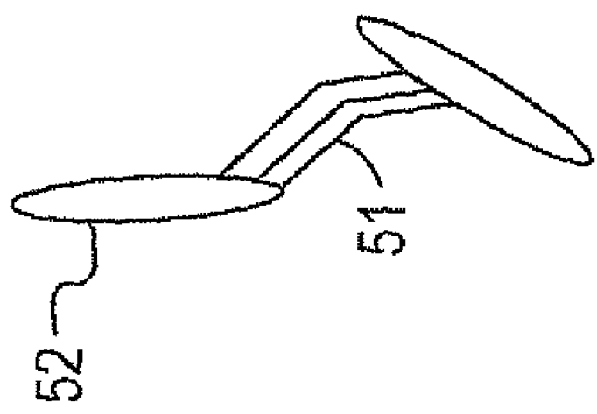
Figure 7:
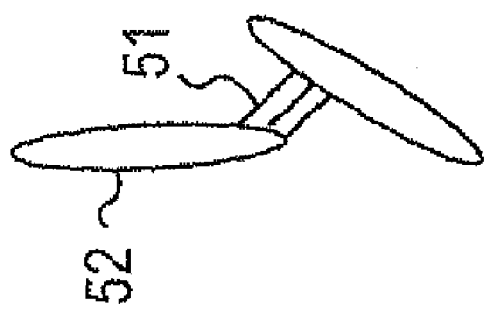

In one embodiment the polymer brushes of the present invention are used to bridge filler particles, such that groups of fillers particles are joined to one another directly through polymer brushes. This may be done through single, double or multi stage brushes. Referring to FIG. 7, some these examples are shown. Polymer brush hairs 51 connect multiple substrates 52 either directly 60, through two brushes linking 62, or through multiple brushes linking 64. This is controlled through the end functional group selection on the hairs and well as the overall percentage of polymer brushes in the resin matrix. Note that the angles joining the various brushes are exaggerated for clarity, and the hairs may in fact be joined straight. or can be overlapped at the junction point (e.g., laddered polymers).

In one embodiment the present invention provides for an resin that comprises, polymer brushes. The polymer brushes themselves comprise structured polymer hairs having a density of 0.8 to 1.0 g/cc, a chain length of 1 to 1000 nm, and in particular 2 to 100 nm, and a thermal conductivity of 0.5 to 5.0 W/mK. The polymer brushes are 10-25% by volume of the resin, and the polymer hairs orient surrounding resin molecules to the polymer hairs alignment. This arrangement creates phonon channels within the resin. In some embodiments the polymer bushes are formed after the resin is impregnated into a porous media, which may be a paper matrix such as mica-glass insulating paper.

In particular embodiments the polymer brushes are created on the surface of a substrate, and may be formed from vinyl monomers. The polymer brushes may also be liquid crystal epoxy.

In other particular embodiments filler materials are added to the resin, and the filler materials comprise 5-40% by volume of the highly structured resin and the filler materials have aspect ratios of 3-100.

In other particular embodiments the resin is an epoxy resin. In converse embodiments, the resin is a hydrocarbon, such as polybutadiene. Other possible resins are polysiloxanes, aromatic polyesters and/or aromatic polyamides.

In another embodiment the present invention provides for an epoxy resin that comprises filler materials and polymer brushes, where the polymer bushes bridge the filler materials within the epoxy resin. The filler materials themselves comprises 5-40% by volume of the highly structured resin and have aspect ratios of 3-100. The filler materials also form a continuous organic-inorganic composite with the epoxy resin and the polymer brushes. The polymer brushes comprise 10-25% by volume of the epoxy resin, and the bridged filler materials create phonon channels within the epoxy resin.

In particular embodiments, the epoxy resin is selected from at least one of liquid crystal polymers, interpenetrating networks, polymer brush type matrices, expanding polymers, ladder polymers, star polymers and structured organic-inorganic hybrids. In other particular embodiments the filler materials comprise one or more of Al2O3, AlN, MgO, ZnO, BeO, BN, Si3N4, SiC and SiO2.

As mentioned, filled resin may be used in the electrical generator field without the tapes to fulfill electrical insulation applications in the rotating and static electrical equipment components. The use of high thermal conductivity materials in a generator is multiple. Within the stator coil there are component materials other than the groundwall which must have high thermal conductivity to optimize the design. Likewise other components associated with the coils to maximize heat removal. Improvements to stator design dictate that improvements be made to rotor design so that generator efficiency can by maximized.

One embodiment of the present invention adds high thermal conductivity (HTC) materials to resins to improve the thermal conductivity of the resins. In some embodiments the other physical properties of the resins are reduced in a trade-off with higher thermal conductivity, but in other embodiments, some of the other physical properties will not be significantly affected, and in some particular embodiments these other properties will be improved. In particular embodiments, the HTC materials are added to resins, such as LCT epoxy, that have ordered sub-structures. When added to these types of resins, the amount of HTC material used can be reduced versus use in resins without ordered sub-structures.

The HTC materials loaded into the resins are of a variety of substances that can be added so that they may physically and/or chemically interact with or react with the resins to improve thermal conductivity. In one embodiment, the HTC materials are polymer brushes, and in another embodiment they are nano or micro inorganic fillers having a defined size or shape including high aspect ratio particles with aspect ratios (ratio mean lateral dimension to mean longitudinal dimension) of 3 to 100 or more, with a more particular range of 10-50.

In a related embodiment, the HTC materials may have a defined size and shape distribution. In both cases the concentration and relative concentration of the filler particles is chosen to enable a bulk connecting (or so-called percolation) structure to be achieved which confers high thermal conductivity with and without volume filling to achieve a structurally stable discrete two phase composite with enhanced thermal conductivity. In another related embodiment, the orientation of the HTC materials increases thermal conductivity. In still another embodiment, the surface coating of the HTC materials enhances phonon transport. These embodiments may stand apart from other embodiments, or be integrally related. For example, polymer brushes are combined with other types of highly structured materials such as thermoset and thermoplastic materials. They are uniformly distributed through a resin matrix such that the HTC materials reduce phonon scattering and provide micro-scale bridges for phonons to produce good thermally conducting interfaces between the HTC materials.

Resins of the present invention may be used for impregnation of other composite constructions such as a mica tape and glass and polyester tape. In addition to the standard mica (Muscovite,Phlogopite) that is typically used for electrical insulation there is also Biotite mica as well as several other mica-like Alumino-Silicate materials such as Kaolinite, Halloysite, Montmorillonite and Chlorite. Montmorillonite has lattices in its structure which can be readily intercalated with polymer resins, metal cations and nano particles to give high dielectric strength composites.

In other embodiments, the present invention is used as a continuous coating on surfaces where insulation is desired; note that "continuous coating" is a description of a macro-scale application. In a continuous coating, the resin forms a coating on materials. When used with a substrate, the HTC materials can be combined with the resin by a variety of different methods. For example, they can be added prior to the resin being added to the substrate, or the resin can be added first, followed by the HTC material and then an additional impregnation of resin. Other fabrication and process methods will be apparent to one of ordinary skill in the art.

Insulating papers are just one type of porous media that may be impregnated with the resin of the present invention. Many other materials and components made therefrom, in many industries, some of which are mentioned below, can use different types of porous media to impregnate the resin into. By way of examples there are glass fiber matrix or fabric, and polymer matrix or fabric, where the fabric might typically be cloth, matt, or felt. Circuit boards, which are glass fabric laminate, with planar lamination, will be one product which will benefit from the use of resins of the present invention.

Although the present invention has been discussed primarily in use with electrical industries, the invention is equally applicable in other areas. Industries that need to increase heat transference would equally benefit from the present invention. For example, the energy, chemical, process and manufacturing industries, inclusive of oil and gas, and the automotive and aerospace industries. Other focuses of the present invention include power electronics, conventional electronics, and integrated circuits where the increasing requirement for enhanced density of components leads to the need to remove heat efficiently in local and large areas. Also, while specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the inventions which, is to be given the full breadth of the claims appended and any and all equivalents thereof.

What is claimed is:

1. A resin comprising: polymer brushes dispersed within said resin, said polymer brushes comprising:
   a base structure comprising a substrate, an initiator layer extending from the substrate, and a polymer layer extending from the initiator layer; and
   a plurality of liquid crystal thermoset epoxy polymer chains that are attached to and extend from the polymer layer of the base structure, wherein said polymer brushes have a density of 0.8 to 1.0 g/cc, a chain length of 1 to 1000 nm, and a thermal conductivity of 0.5 to 5.0 W/mK;
   wherein said polymer brushes are configured to increase an ordering of the polymer chains and resin molecules within the resin, thereby increasing a thermal conductivity of the resin.

2. The resin of claim 1, wherein said substrate comprises a surface of a particle or a surface of a polymer.

3. The resin of claim 1, wherein the resin further comprises high thermal conductivity (HTC) filler materials, wherein said HTC filler materials comprise 5-40% by volume of said resin, and wherein said HTC filler materials have aspect ratios of 3-100.

4. The resin of claim 1, wherein the polymer brushes have a chain length of 2 to 100 nm.

5. The resin of claim 1, wherein said resin comprises an epoxy resin.

6. The resin of claim 1, wherein said resin comprises a hydrocarbon.

7. The resin of claim 1, wherein said resin comprises at least one of a polybutadiene, a polysiloxane, an aromatic polyester, or an aromatic polyamide.

8. The resin of claim 1, wherein said polymer brushes comprise 10-25% by volume of said resin.

9. An insulating tape comprising the resin of claim 1.

10. An epoxy resin comprising:
high thermal conductivity (HTC) filler materials that comprise 5-40% by volume of said epoxy resin, wherein said HTC filler materials have aspect ratios of 3-100; and
polymer brushes dispersed within said epoxy resin, wherein said polymer brushes are attached to and extend between adjacent HTC filler materials within said epoxy resin to form bridged HTC filler materials;
wherein said HTC filler materials form a continuous organic-inorganic composite with said epoxy resin and said polymer brushes;
wherein said polymer brushes comprise 10-25% by volume of said epoxy resin; and
wherein said bridged HTC filler materials create phonon channels within said epoxy resin; and
wherein said polymer brushes comprise a plurality of polymer chains having a chain length of 1 to 1000 nm.

11. The epoxy resin of claim 10, wherein said epoxy resin comprises at least one of liquid crystal thermoset polymers, interpenetrating networks, polymer brush type matrices, expanding polymers, ladder polymers, star polymers or structured organic-inorganic hybrids.

12. The epoxy resin of claim 11, wherein said HTC filler materials comprise one or more of $Al_2O_3$, AlN, MgO, ZnO, BeO, BN, $Si_3N_4$, SiC and $SiO_2$.

13. The epoxy resin of claim 10, wherein the polymer chains have a density of 0.8 to 1.0 g/cc and a thermal conductivity of 0.5 to 5.0 W/mK.

14. An insulating tape comprising the epoxy resin of claim 10.

15. The resin of claim 1, wherein said substrate comprises at least one of alumina, silica, boron nitride, a polymer, mica, or glass fibers.

16. The resin of claim 1, wherein the plurality of liquid crystal thermoset epoxy polymer chains extend from a polymer layer comprising an epoxy-vinyl monomer.

17. The resin of claim 1, wherein resin molecules surrounding said polymer hairs in said resin are oriented in the same direction as said polymer chains.

* * * * *